United States Patent
Keating

(10) Patent No.: US 7,799,139 B2
(45) Date of Patent: Sep. 21, 2010

(54) CHEMISTRY FOR REMOVAL OF PHOTO RESIST, ORGANIC SACRIFICIAL FILL MATERIAL AND ETCH POLYMER

(75) Inventor: Steven Keating, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 614 days.

(21) Appl. No.: 11/692,349

(22) Filed: Mar. 28, 2007

(65) Prior Publication Data

US 2008/0242102 A1    Oct. 2, 2008

(51) Int. Cl.
*C11D 7/50*    (2006.01)
*G03F 7/42*    (2006.01)

(52) U.S. Cl. .................................... 134/1.3; 510/175
(58) Field of Classification Search ............. 510/175; 134/1.3
See application file for complete search history.

(56) References Cited

U.S. PATENT DOCUMENTS

| | | | |
|---|---|---|---|
| 2001/0051318 A1* | 12/2001 | Chu ........................... | 430/329 |
| 2008/0047592 A1* | 2/2008 | Fisher et al. .................. | 134/41 |
| 2009/0118153 A1* | 5/2009 | Rath et al. .................. | 510/176 |

* cited by examiner

*Primary Examiner*—Gregory E Webb
(74) *Attorney, Agent, or Firm*—Kathy J. Ortiz

(57) ABSTRACT

Methods and associated structures of forming a microelectronic device are described. Those methods may include utilizing a cleaning mixture comprising a solvent such as ethylene glycol monopropyl ether, an inorganic base, an organic base, a copper corrosion inhibitor and a surfactant to clean at least one of a polymer residue, a organic sacrificial fill material and etched or un-etched photo resist from a Damascene structure of a microelectronic structure comprising a porous oxide dielectric.

6 Claims, 3 Drawing Sheets

CHEMISTRY FOR REMOVAL OF PHOTO RESIST, ORGANIC SACRIFICIAL FILL MATERIAL AND ETCH POLYMER

BACKGROUND OF THE INVENTION

The use of porous low k dielectric materials for Dual Damascene patterning in microelectronic devices requires much higher selectivity for removal of organic sacrificial fill material and etched or un-etched photo resist during cleaning, while preventing attack (undercut) of the porous low k interlayer dielectric (ILD) material. In addition, transitioning from a wet cleaning platform utilizing batch processing to a single wafer process requires reduction of etching times from about 10 minutes to about 1 min. Cleaning must be accomplished with no degradation of the dielectric constant and with no damage to metal (such as copper, titanium or tungsten) portions, of the Damascene structure.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
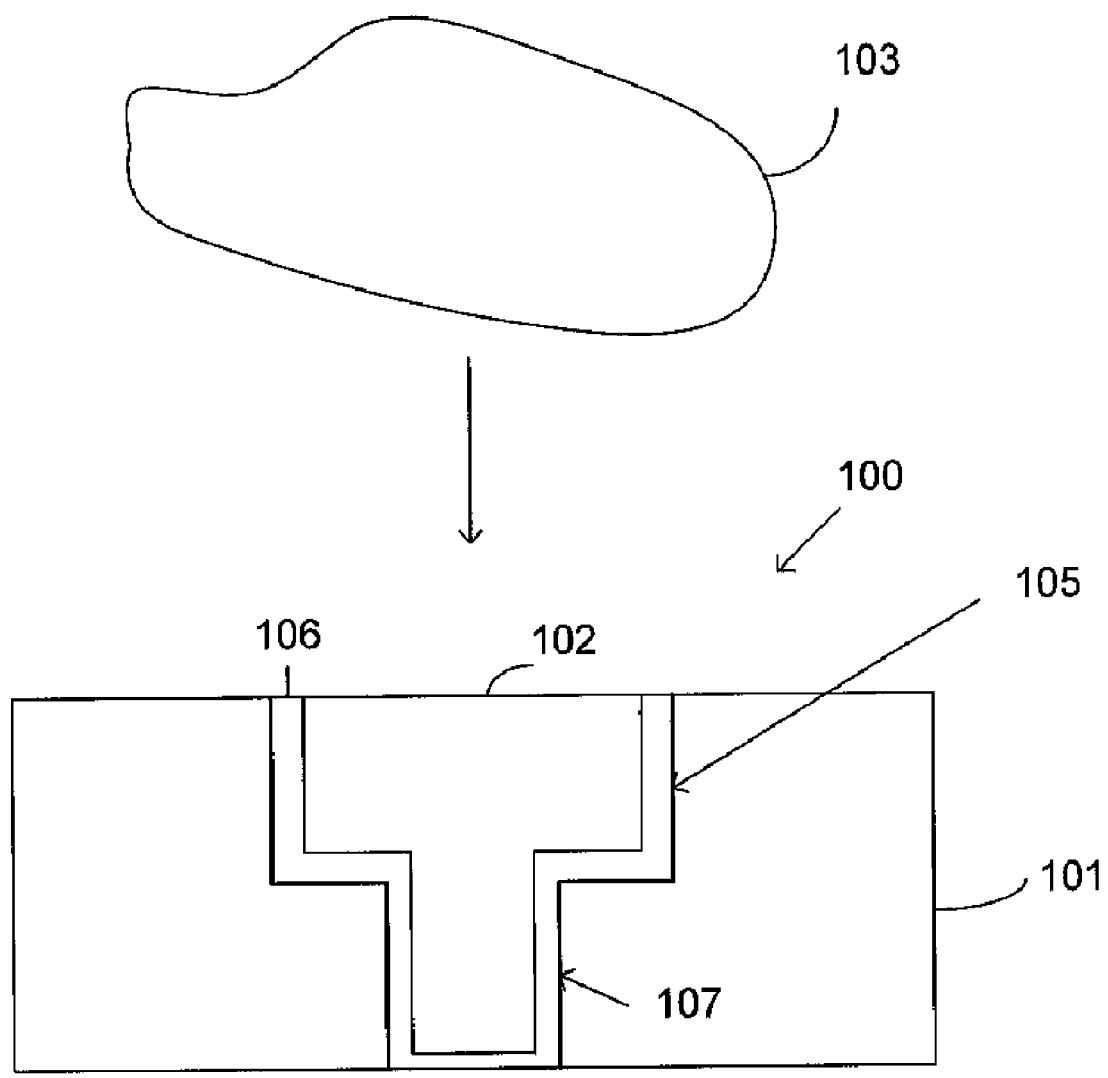
FIGS. 1a and 1c represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include utilizing a cleaning mixture comprising ethylene glycol monopropyl ether, an inorganic base, an organic base, an inhibitor and a surfactant to clean at least one of a polymer residue, a organic sacrificial fill material and etched or un-etched photo resist from a Damascene structure comprised of a porous oxide. Methods of the present invention significantly prevent undercutting of porous dielectric films during organic sacrificial fill material removal cleans, for example.

Figure 1B:
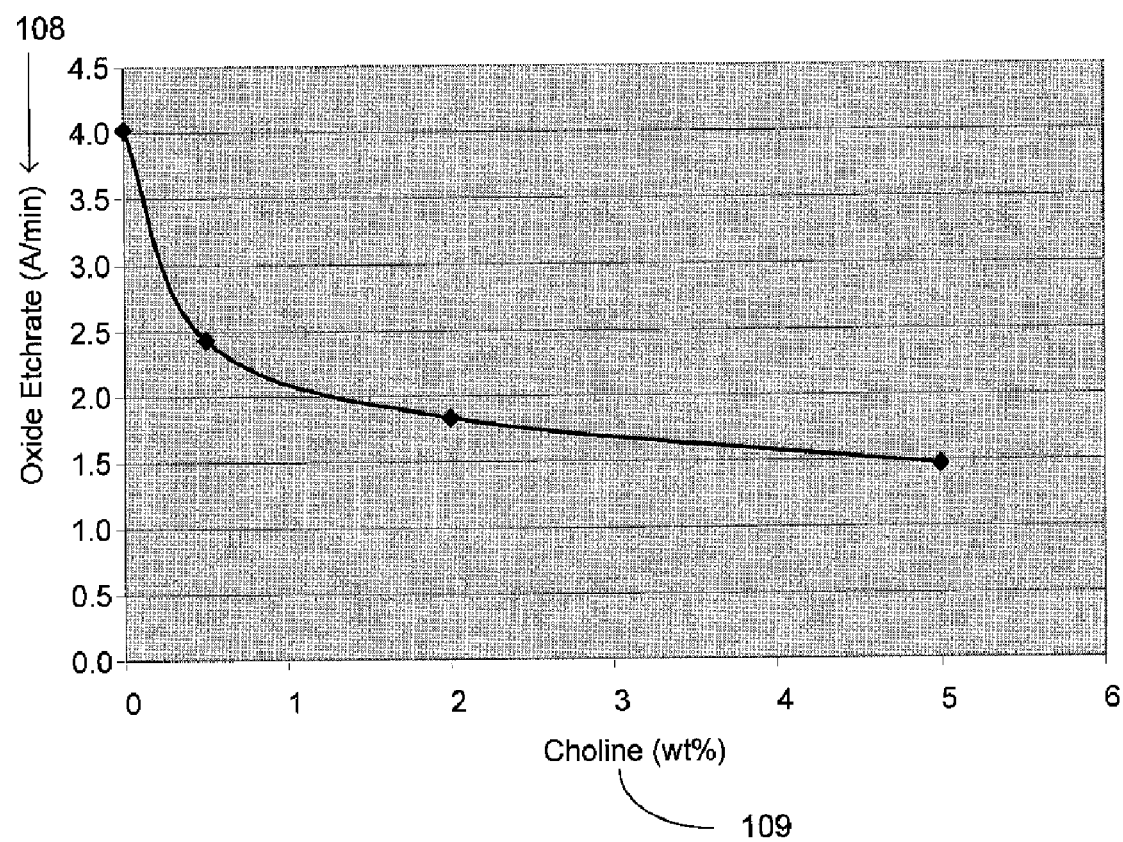
FIG. 1b represents a graph according to and embodiment of the present invention.
Figure 1C:
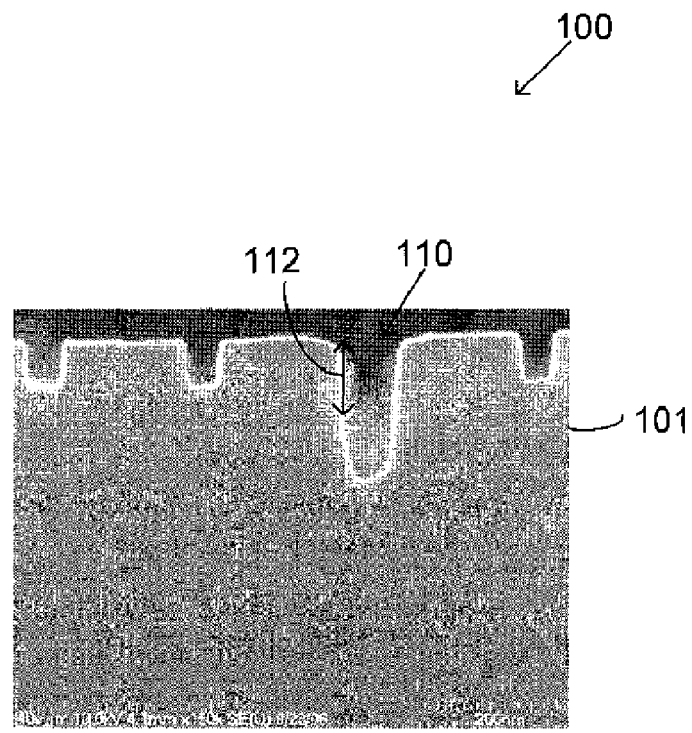

FIGS. 1a-1c illustrate an embodiment of a method of cleaning a microelectronic structure, such as a damascene structure, for example. FIG. 1a illustrates a cross-section of a portion of a microelectronic structure 100, such as a a dual damascene structure of a microelectronic device, for example. The microelectronic structure 100 may comprise a high aspect ratio structure in some embodiments, wherein in the aspect ratio may be greater than about 3:1.

In some embodiments, the microelectronic structure 100 may be a portion of a microelectronic device which may include various components such as but not limited to transistors, capacitors, resistors, and the like. In one embodiment, transistors of the microelectronic device may comprise geometries, such as a channel length, for example, of about 45 nm or less.

The microelectronic structure 100 may comprise a barrier layer 106 and a conductive layer 102, and may further comprise a trench portion 105 and a via portion 107. The microelectronic structure 100 may also include a low K dielectric layer 101. In one embodiment the dielectric layer 101 may comprise a carbon doped oxide (CDO). In another embodiment, the dielectric layer 101 may comprise a porous oxide material, and may further comprise a dielectric constant below about 4, In one embodiment, the barrier layer 106 and the conductive layer 102 may be formed after the trench portion 105 and the via portion 107 are formed in the dielectric layer 101.

In one embodiment, the barrier layer 106 may be formed on the dielectric layer 100 within the trench 105 and via openings 107, and the conductive layer 102 may then be formed on the barrier layer 106 to fill the trench 105 and via 107 portions. A removal process, such as but not limited to a polishing process may remove portions of the conductive layer 102 and the barrier layer 106 that may be disposed outside and/or above the trench portions 107 of the microelectronic structure 100, such as by employing a chemical mechanical process (CMP), for example. The microelectronic structure 100 may be exposed to other processes, such as plasma etching processes, for example.

In one embodiment, the removal process and/or previous process steps may require the subsequent removal of residue from the microelectronic structure 100, which may comprise etched or unetched photo resist, organic sacrificial fill material, anti-reflective coating (ARC) and/or etch polymer material in some cases, but may comprise any type of residue that may need to be cleaned from the microelectronic structure 100.

A cleaning solution 103 may be employed to clean the microelectronic structure 100 after patterning processes have been performed, such as after a via etch, trench etch, or break-through, for example. In one embodiment, the cleaning solution 103 may contain a solvent comprising at least one of: ethylene glycol monopropyl ether, diethylene glycol monopropyl ether, 3-Methoxypropylamine, 2-(Diethylamino)ethanol, other glycol monopropyl ethers, glycol monoethyl ethers or etheramines; an inorganic base, an organic base, an inhibitor and a surfactant. In one embodiment, the ethylene glycol monopropyl ether may comprise a concentration of about 10 to about 30 percent by weight.

In one embodiment, the inorganic base comprises a concentration of about 0.5 to about 5 percent by weight, and comprises at least one of Potassium Hydroxide, Calcium Hydroxide or other Alkaline Earth (Be, Mg, Ca, Sr, Ba) or Alkaline Metal (Li, Na, K, Rb, Cs, Fr) hydroxides; and wherein the organic base comprises a concentration of 2 to about 20 percent by weight, and comprises at least one of Tetraethylammonium Hydroxide, Choline Hydroxide, or Tetraethylammonium Hydroxide.

FIG. 1b depicts the inhibition of the porous oxide etch rate 108 by adding percent by weight of choline hydroxide 109, when the solvent comprises about 20 percent by weight and TMAH comprises about 15 percent by weight. A similar effect may be seen when using tetraethylammonium hydroxide as the organic base. In one embodiment, the copper corrosion inhibitor may comprise a concentration of about 0.005 to about 1 percent by weight, and may comprise at least one of: a) Heptanethiol and other alkane thiols having formulas $CH_3(CH_2)_nSH$ (where n=5-12), b) 2-Mercaptobenzimidazole, Mercaptobenzothiazole, Benzothiazole and other aromatic thiols, c) 3,6-dioxa-1,8-octanedithol, 3-Mercaptopropionic acid, Methyl 3-mercaptopropionate, Butyl 3-mercaptopropionate, and other alkoxy thiols.

In one embodiment, the surfactant may comprise a concentration of about less than about 1 percent by weight, and may comprise at least one of an alkanol polyethoxylate chain and an alkanol aromatic ring, an alkano polyethylene oxide sulfopropyl ether and an alkyl benzene sulfonate. In one embodiment, the surfactant may comprise a potassium salt with or without glycol added. The cleaning solution 103 may comprise a pH of about 11 to about 14.

In one embodiment, the cleaning solution 103 may be heated to a temperature of between about 40 degrees Celsius to about 60 degrees Celsius. At least one of a organic sacrificial fill material, photo resist and etch polymer may be removed from from the microelectronic structure 100 using the cleaning solution 103.

In one embodiment, a porous oxide etch rate, such as may be used for the dielectric layer 101 in the microelectronic structure 100, may comprise an etch rate of about 0.7 angstroms per minute to about 10 angstroms per minute in the cleaning solution 103. In one embodiment, an etch rate of organic sacrificial fill material in the cleaning solution may comprise between about 5,000 angstroms per minute to about 16,000 angstroms per minute, and an etch rate of photo resist may comprise between about 16,000 to about 20,000 angstroms per minute. Simultaneously, the etchrate of Copper is suppressed to less than about 2 angstroms per min.

Thus, the selectivity of resist to the porous oxide may comprise between about 8,000 to about 20,000, and a selectivity of the organic sacrificial fill material to the porous oxide comprises between about 7,000 to about 9,000. In one embodiment, the microelectronic structure 100 may further comprise a guard ring 110, as is known in the art, which may be defined and/or surrounded by the dielectric layer 101, and may reside in another portion of the microelectronic structure 100, such as in another portion of a silicon wafer (FIG. 1c). In other embodiments the structures may consist of isolated vias or trenches <100 nm wide.

Figure 1D:
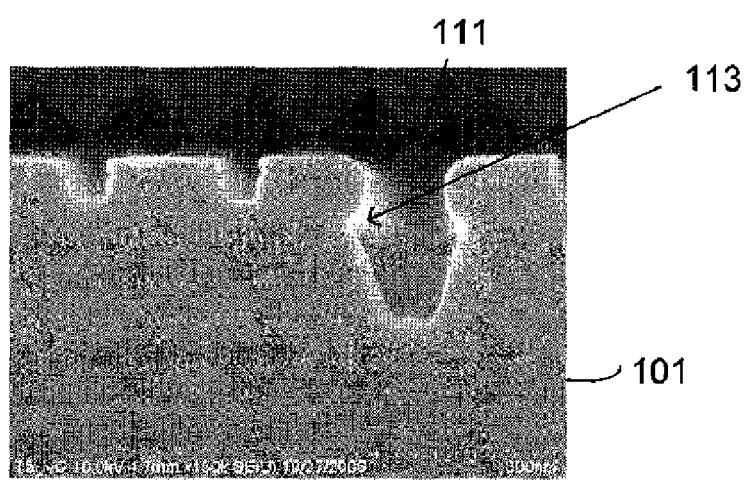
FIG. 1d represents a structure according to the Prior Art.

At least one of organic sacrificial fill material, resist and polymer may be cleaned from the guard ring 110 using the cleaning solution 103, wherein the guard ring 110 is not undercut, as depicted by the vertical profile 112 in FIG. 1c. In a similar manner, other features defined in and/or surrounded by the dielectric layer 101 will not be undercut (i.e. the dielectric layer 101 surrounding the feature will not be etched and/or lose a desired vertical profile) by the cleaning solution 103, since the preferential etching of the photo resist and organic sacrificial fill material relative to the dielectric layer 101 is so high. FIG. 1d. depicts a guard-ring 111 cleaned by a prior art cleaning solution, wherein an undercut 113 in the porous low K dielectric 101 may frequently occur.

The cleaning solution 103 may clean and/or clear the guard ring 110 of at least one of organic sacrificial fill material, resist and polymer ring in about 50 seconds to about 2.5 minutes at 50 degrees C. Single vias <100 nm in diameter can also be cleared of organic sacrificial fill material in less than 1 minute. In one embodiment, metallic structures disposed within and on the Damascene structure are not etched by the cleaning mixture, such as copper materials, for example.

Thus, the benefits of the embodiments of the present invention include, but are not limited to, preventing undercutting of porous dielectric materials during organic sacrificial fill material, resist and polymer removal cleans, enabling short process times suitable for single wafer cleaning platforms, thus improving throughput, and reducing costs of processing by about 50 percent by using less expensive ingredients and more dilute concentrations than the prior art. Cost may be reduced even further by preparing the chemistry in more concentrated form, then diluting with water at the point of usage.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising applying a cleaning mixture comprising at least one of ethylene glycol monopropyl ether, diethylene glycol monopropyl ether, 3-Methoxypropylamine, 2-(Diethylamino)ethanol, glycol monopropyl ethers, glycol monoethyl ethers and etheramines, an inorganic base comprising 0.5 to about 5 percent by weight, an organic base comprising 2 to 20 percent by weight, an inhibitor comprising at least one of Heptanethiol, 2-Mercaptobenzimidazole, Mercaptobenzothiazole, Benzothiazole, 3,6-dioxa-1,8-octanedithol, 3-Mercaptopropionic acid, Methyl 3-mercaptopropionate, Butyl 3-mercaptopropionate and comprising about 0.005 to about 1 percent by weight, and a surfactant comprising less than about 1 percent by weight to a Damascene structure of a microelectronic structure comprising a porous oxide dielectric, wherein the dielectric constant is below about 4; and removing at least one of a polymer residue, an organic sacrificial fill material and photo resist from the Damascene structure by the application of the cleaning mixture, wherein a removal rate of the porous oxide dielectric comprises about 0.7 angstroms per minute to about 10 angstroms per minute.

2. The method of claim 1 wherein a selectivity of the resist to the porous oxide comprises between about 8,000 to about 20,000, and a selectivity of the organic sacrificial fill material to the porous oxide comprises between about 7,000 to about 9,000.

3. The method of claim 1 further comprising wherein the microelectronic structure further comprises a guard ring, wherein at least one of organic sacrificial fill material, resist and polymer is cleaned from the guard ring, and wherein the guard ring is not undercut.

4. The method of claim 3 wherein the time to clear the guard ring is from about 50 seconds to about 2.5 minutes.

5. The method of claim 1 wherein metallic structures disposed within and on the Damascene structure are not removed by the cleaning mixture.

6. The method of claim 1 wherein the porous oxide comprises a low k dielectric.

* * * * *